(12) United States Patent
Otsuka

(10) Patent No.: US 8,587,763 B2
(45) Date of Patent: Nov. 19, 2013

(54) SUBSTRATE PROCESSING METHOD, SUBSTRATE PROCESSING SYSTEM, AND COMPUTER-READABLE RECORDING MEDIUM RECORDING PROGRAM THEREON

(75) Inventor: Takahisa Otsuka, Koshi (JP)

(73) Assignee: Tokyo Elctron Limited, Tokyo (JP)

( * ) Notice: Subject to any disclaimer, the term of this patent is extended or adjusted under 35 U.S.C. 154(b) by 245 days.

(21) Appl. No.: 13/158,971

(22) Filed: Jun. 13, 2011

(65) Prior Publication Data

US 2011/0237088 A1  Sep. 29, 2011

Related U.S. Application Data

(62) Division of application No. 11/951,581, filed on Dec. 6, 2007, now Pat. No. 7,977,038.

(30) Foreign Application Priority Data

Dec. 21, 2006 (JP) ................................. 2006-344571

(51) Int. Cl.
*G03B 27/42* (2006.01)
*H01L 21/306* (2006.01)
*G06F 19/00* (2011.01)

(52) U.S. Cl.
USPC ......... 355/53; 700/121; 700/300; 156/345.27

(58) Field of Classification Search
USPC ...................... 374/45; 700/121, 300; 355/53; 156/345.27
See application file for complete search history.

(56) References Cited

U.S. PATENT DOCUMENTS 6,002,108 A   12/1999  Yoshioka
6,318,948 B1  11/2001  Ueda et al.
(Continued)

FOREIGN PATENT DOCUMENTS

JP   3-268419   11/1991
JP   04-84413    3/1992
(Continued)

OTHER PUBLICATIONS

Office Action issued Apr. 5, 2011, in Japanese Application No. 2006-344571 (with English translation), filed Dec. 21, 2006.

(Continued)

*Primary Examiner* — Amanda C. Walke
(74) *Attorney, Agent, or Firm* — Oblon, Spivak, McClelland, Maier & Neustadt, L.L.P.

(57) ABSTRACT

In the present invention, the position of a substrate on a thermal plate is detected when baking after exposure is performed in a first round of patterning. In a second round of patterning, the setting position of the substrate is adjusted based on a detection result of the position before the substrate is mounted on the thermal plate in the baking after exposure. In the baking after exposure in the second round of patterning, the substrate is mounted at the same position with respect to the thermal plate as that in the baking after exposure in the first round of patterning. In performing a plurality of rounds of patterning on a film to be processed, a pattern with a desired dimension is finally formed above the substrate, and the uniformity of the pattern dimension within the substrate is ensured.

15 Claims, 11 Drawing Sheets

(56) References Cited

U.S. PATENT DOCUMENTS

| | | |
|---|---|---|
| 6,790,681 B2 | 9/2004 | Matsunaga et al. |
| 7,256,873 B2 | 8/2007 | Finders et al. |
| 7,326,505 B2 | 2/2008 | Raulea |
| 7,563,043 B2 | 7/2009 | Kaneko et al. |
| 7,802,986 B2 * | 9/2010 | Ooshima et al. .............. 432/250 |
| 7,815,366 B2 * | 10/2010 | Okamura et al. ............... 374/45 |
| 7,822,574 B2 * | 10/2010 | Ogata et al. ................... 702/118 |
| 7,910,863 B2 * | 3/2011 | Jyousaka et al. ............. 219/482 |
| 7,957,828 B2 * | 6/2011 | Tadokoro et al. ............. 700/121 |
| 7,964,042 B2 * | 6/2011 | Kojimaru et al. ............. 134/26 |
| 8,135,487 B2 * | 3/2012 | Jyousaka et al. ............. 700/121 |
| 2004/0101790 A1 | 5/2004 | Cauchi et al. |
| 2005/0200818 A1 | 9/2005 | Ryu et al. |

FOREIGN PATENT DOCUMENTS

| | | |
|---|---|---|
| JP | 06-104170 | 4/1994 |
| JP | 07-147219 | 6/1995 |
| JP | 2000-138158 | 5/2000 |
| JP | 2001-93828 | 4/2001 |
| JP | 2005-123651 | 5/2005 |
| WO | WO 2006051774 A1 * | 5/2006 |

OTHER PUBLICATIONS

Japanese Office Action issued Dec. 20, 2011, in Patent Application No. 2006-344571 (with English-language translation).

* cited by examiner

SUBSTRATE PROCESSING METHOD, SUBSTRATE PROCESSING SYSTEM, AND COMPUTER-READABLE RECORDING MEDIUM RECORDING PROGRAM THEREON

CROSS-REFERENCE TO RELATED APPLICATIONS

The present application is a Divisional of U.S. Ser. No. 11/951,581 filed Dec. 6, 2007 which claims priority under 35 U.S.C. 119 to Japanese Patent Application No. 2006-344571, filed on Dec. 21, 2006. The entire contents of U.S. Ser. No. 11/951,581 are incorporated by reference herein.

BACKGROUND OF THE INVENTION

1. Field of the Invention

The present invention relates to a substrate processing method, a substrate processing system, and a computer-readable recording medium recording a program thereon.

2. Description of the Related Art

In a process of manufacturing a semiconductor device, for example, patterning processing is performed for forming a predetermined pattern in a specific film to be processed above a wafer. In the patterning processing of the film to be processed, for example, a resist coating treatment of applying a resist solution onto a top of the film to be processed above the wafer to form a resist film, exposure processing of applying light in a predetermined pattern to the resist film above the wafer surface to expose the resist film, heating processing of heating the wafer to accelerate the chemical reaction in the exposed resist film (post-exposure baking), developing treatment of developing the heated resist film, heating processing of heating the wafer after developing treatment (post-baking) and so on are performed in sequence using the photolithography technique, so that a predetermined resist pattern is formed in the resist film above the wafer surface. Thereafter, the film to be processed is etched using the resist pattern as a mask, and the resist pattern is then removed, whereby a predetermined pattern is formed in the film to be processed.

To form a finer pattern to further miniaturize the semiconductor device, conventionally the wavelength of light for use in the exposure processing in the above-described patterning processing has been increasingly reduced. Only by the method of increasing the reduction in the wavelength for exposure, however, it is difficult to form a fine semiconductor device at a level of, for example, 32 nm or 45 nm.

Hence, it is proposed to perform a plurality of rounds of patterning on the film to be processed at the same layer above the wafer surface to form a finer pattern, so as to miniaturize the semiconductor device (Japanese Patent Application Laid-open No. H7-147219).

The heating processing in the above-described patterning processing, for example, the post-exposure baking is normally performed in a post-exposure baking unit and by mounting the wafer on a thermal plate which is adjusted to a predetermined temperature.

Incidentally, since the heating temperature in the post-exposure baking greatly affects the dimension of a final pattern, the temperature of the thermal plate in the post-exposure baking unit is controlled to be uniform within the mounting surface. However, slight unevenness of temperature having a certain tendency within the thermal plate actually occurs due to the performance of the thermal plate itself, the ambient environment or the like. Therefore, certain unevenness of dimension within the wafer according to the tendency of the unevenness of temperature of the thermal plate will occur in the pattern of the wafer processed by the thermal plate. In other words, according to the temperature tendency of the thermal plate, a portion Rw where the line width is relatively large and a portion Rn where the line width is relatively small are created in the pattern within the wafer, for example, as shown at (I) in FIG. 14.

When a plurality of rounds of performing are performed on the film to be processed at the same layer as described above, the post-exposure baking is performed for each of the rounds of patterning and the wafer is transferred to the post-exposure baking unit every time, so that the mount position of the wafer with respect to the thermal plate may be deviated, for example, in the rotation direction between the rounds of patterning. Along with deviation of the mount position of the wafer, the above-described unevenness of dimension of the pattern within the wafer also deviates, and a final pattern is formed having unevenness of dimension different in each of the rounds of patterning added in a plurality of rounds of patterning. This results in a failure to form a pattern with a desired dimension above the wafer and in a non-uniform dimension of the pattern within the wafer.

If the portion where the line width is relatively small in the second round of patterning is overlapped on the portion Rw where the line width is relatively large in the first round of patterning like the wafer W shown at (I) in FIG. 14, the line width of the final pattern becomes large as shown at (II) in FIG. 14. On the other hand, if the portion where the line width is relatively large in the second round of patterning is overlapped on the portion Rn where the line width is relatively small in the first round of patterning like a wafer W shown at (I) in FIG. 14, the line width of the final pattern becomes small as shown at (II) in FIG. 14. Thus, a pattern with a desired line width is not formed finally, and the line width within the wafer varies.

Accordingly, it is difficult to finally form a pattern with a desired dimension and ensure the uniformity of the pattern dimension within the wafer by the conventional method of performing a plurality of rounds of patterning.

SUMMARY OF THE INVENTION

The present invention has been developed in consideration of the above points, and its object is to finally form a pattern with a desired dimension on a substrate such as a wafer and to ensure the uniformity of the pattern dimension within the substrate even when a plurality of rounds of patterning are performed.

To attain the above object, the present invention is a substrate processing method of performing a plurality of rounds of patterning on a film to be processed located at a same layer above a surface of a substrate, including a thermal processing step of mounting and thermally processing the substrate on a thermal processing plate in each of the rounds of patterning.

A position of the substrate with respect to the thermal processing plate when the substrate is mounted on the thermal processing plate in the thermal processing step in each of second and subsequent rounds of patterning is aligned with a position of the substrate with respect to the thermal processing plate when the substrate is mounted on the thermal processing plate in the thermal processing step in a first round of patterning. Note that "the position of the substrate with respect to the thermal processing plate" includes at least either the position in the rotation direction (a so-called θ-direction) of the substrate on the thermal processing plate or the position of the horizontal direction (an X-Y direction).

According to the present invention, the position of the substrate on the thermal processing plate in each of the second and subsequent rounds of patterning is aligned with the position of the substrate on the thermal processing plate in the first round of patterning, so that the substrate is mounted at the same position on the thermal processing plate and subjected to thermal processing at all times in a plurality of rounds of patterning. As a result, patterns having a certain in-plane tendency of dimension are formed in an overlap manner at the same position in the plurality of rounds of patterning, so that a pattern with a desired dimension is finally formed. In addition, the uniformity of pattern dimension within the substrate can be ensured.

The present invention according to another aspect is a substrate processing system for performing a plurality of rounds of patterning on a film to be processed located at a same layer above a surface of a substrate, including: a thermal processing palate for mounting and thermally processing the substrate thereon in each of the rounds of patterning; and an aligning mechanism for aligning a position of the substrate with respect to the thermal processing plate when the substrate is mounted on the thermal processing plate in the thermal processing in each of second and subsequent rounds of patterning with a position of the substrate with respect to the thermal processing plate when the substrate is mounted on the thermal processing plate in the thermal processing in a first round of patterning.

The present invention according to still another aspect is a computer-readable recording medium recording a program thereon for causing a computer controlling a substrate processing system to implement the substrate processing method, the substrate processing system performing a plurality of rounds of patterning on a film to be processed located at a same layer above a surface of a substrate.

According to the present invention, a pattern with a desired dimension can be formed in a film to be processed above a substrate by a plurality of rounds of patterning, thus promoting the miniaturization of a semiconductor device.

DETAILED DESCRIPTION OF THE INVENTION

Figure 1:
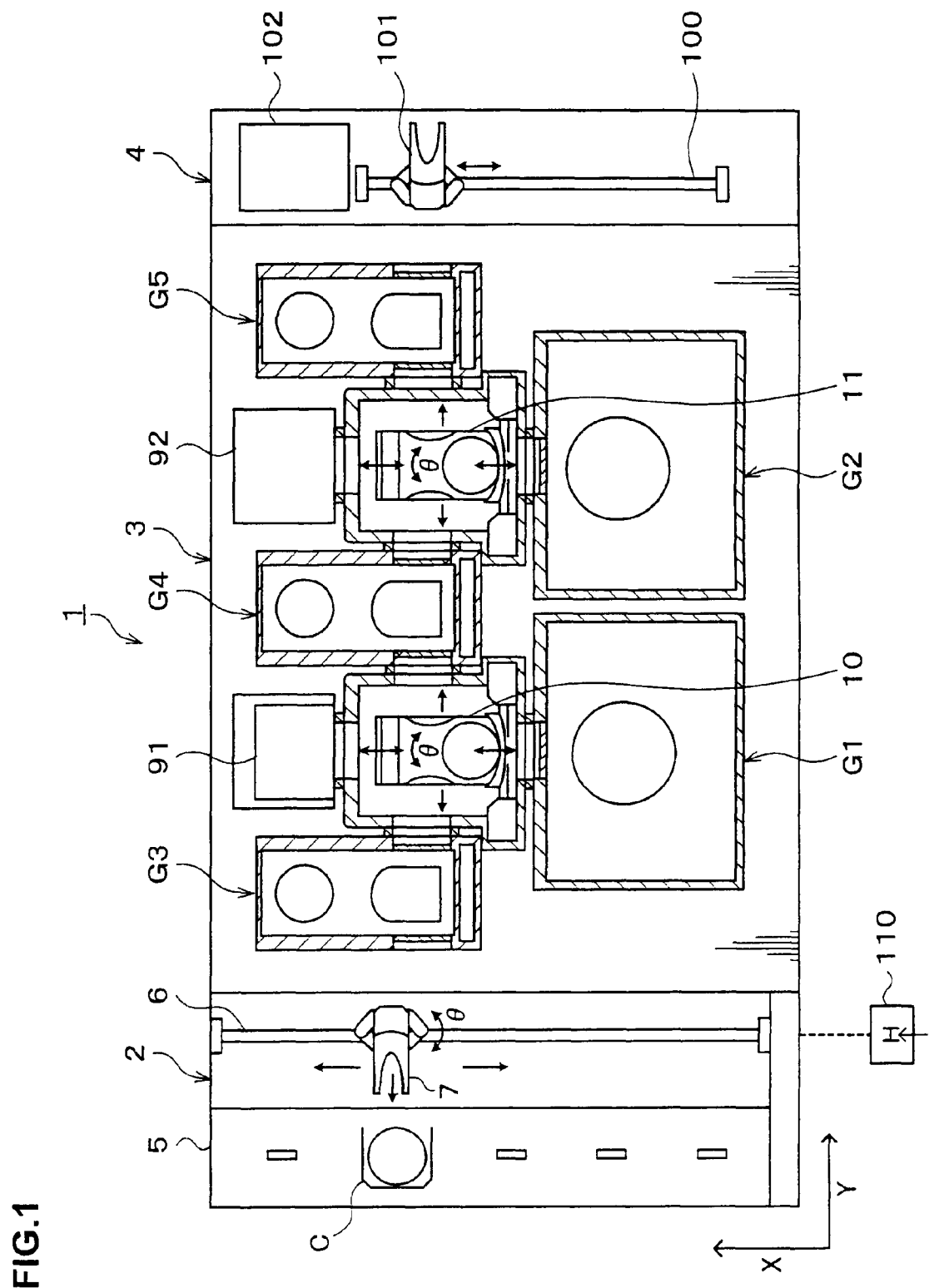
FIG. 1 is a plan view showing a configuration of a coating and developing treatment system.
Figure 2:
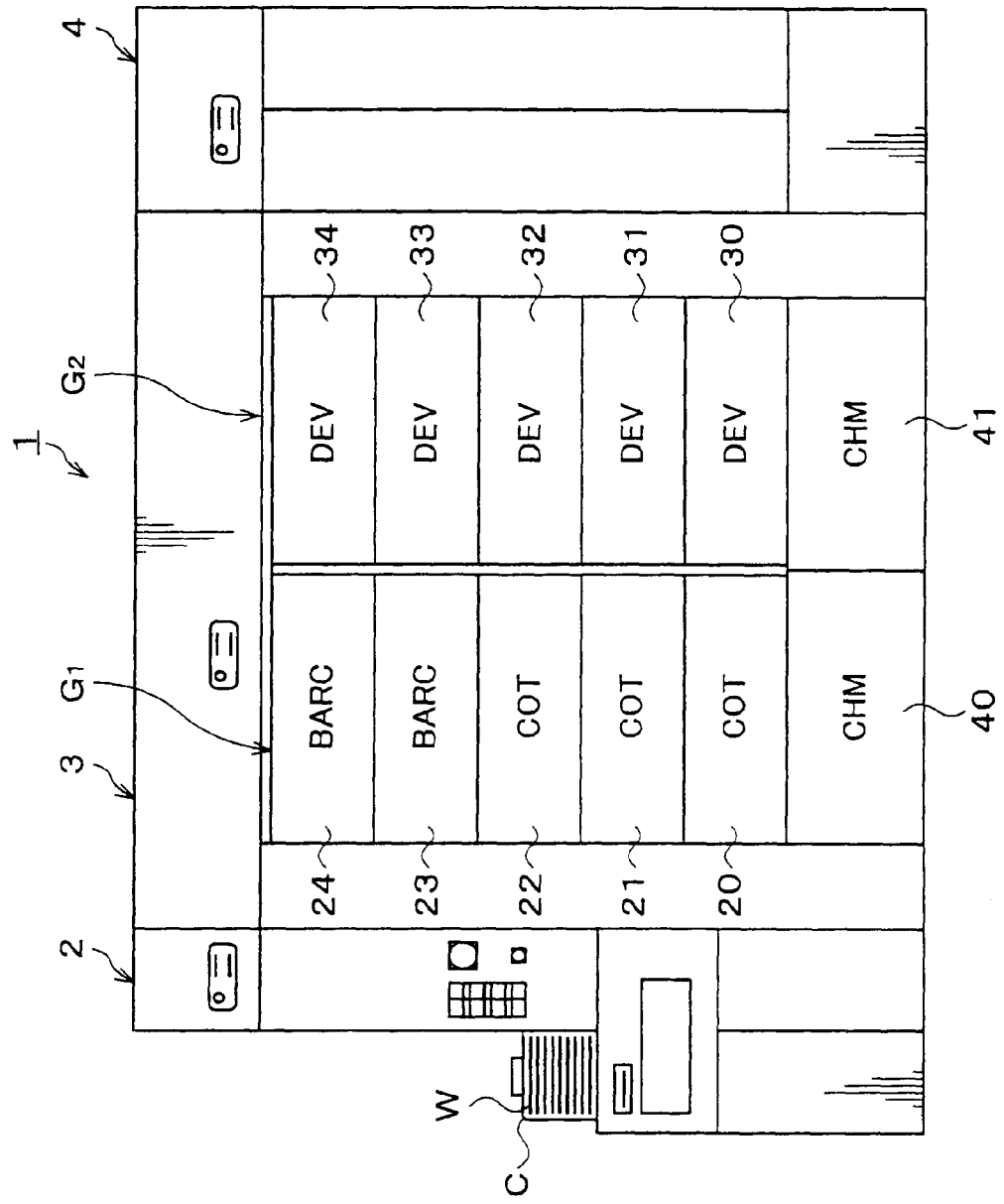
FIG. 2 is a front view of the coating and developing treatment system in FIG. 1.
Figure 3:
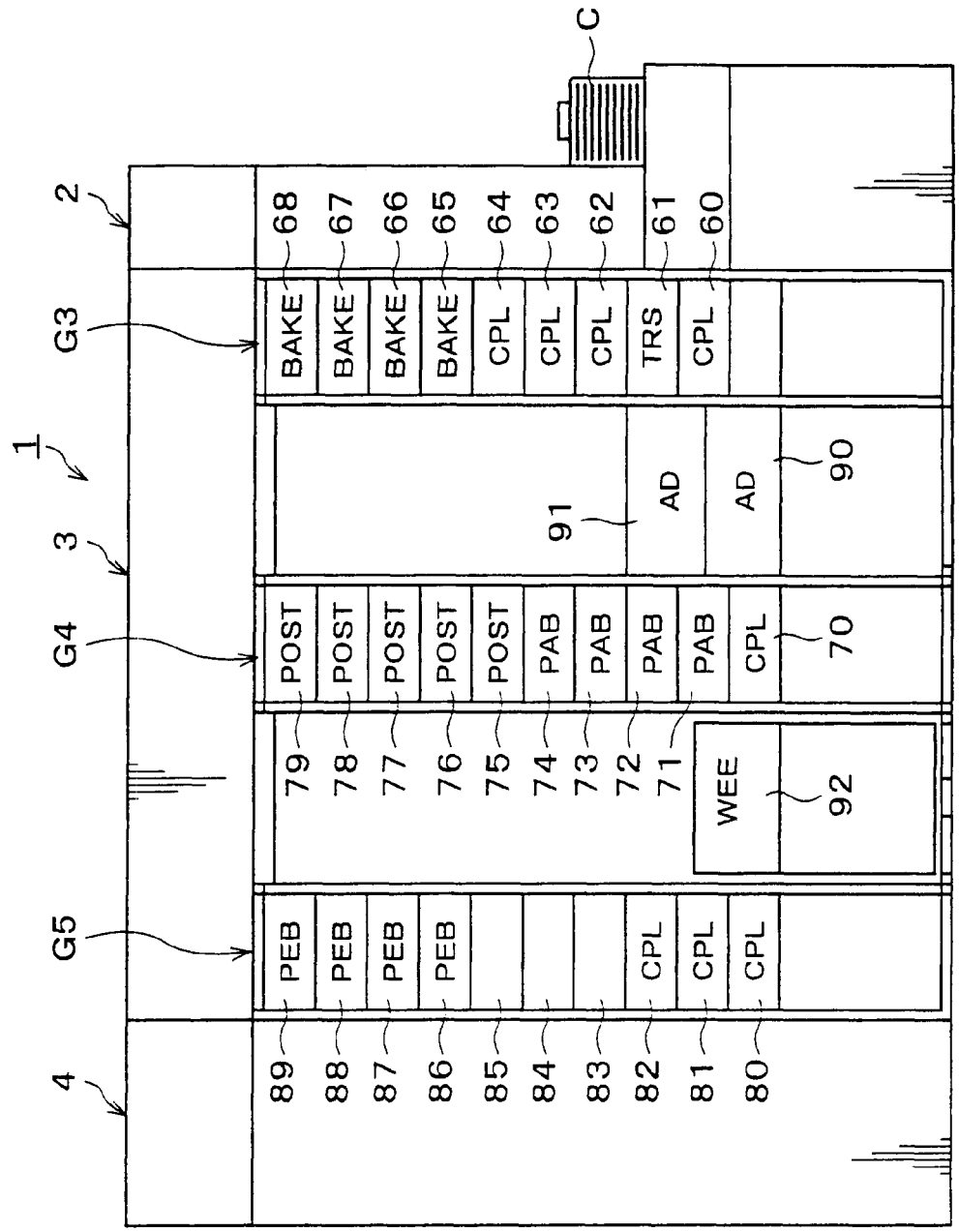
FIG. 3 is a rear view of the coating and developing treatment system in FIG. 1.

Hereinafter, a preferred embodiment of the present invention will be described. FIG. 1 is a plan view showing the outline of a configuration of a coating and developing treatment system 1 as a substrate processing system according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, each for performing predetermined processing or treatment in a manner of single wafer processing in the photolithography process; and an interface station 4 for delivering the wafers W to/from an exposure apparatus (not shown) provided adjacent to the processing station 3, are integrally connected together.

In the cassette station 2, a cassette mounting table 5 is provided and configured such that a plurality of cassettes C can be mounted thereon in a line in an X-direction (a top-to-bottom direction in FIG. 1). In the cassette station 2, a wafer transfer body 7 is provided which is movable on a transfer path 6 along the X-direction. The wafer transfer body 7 is also movable in an arrangement direction of the wafers W housed in the cassette C (a Z-direction; the vertical direction), and thus can selectively access the wafers W vertically arranged in the cassette C. The wafer transfer body 7 is rotatable around an axis in the vertical direction (in a θ-direction), and can access processing and treatment units included in a later-described third processing unit group G3 in the processing station 3.

The processing station 3 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit 10 is provided.

The first transfer unit 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 11 is provided. The second transfer unit 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W to a form a resist film, and bottom coating units 23 and 24 each for forming an anti-reflection film that prevents reflection of light during exposure processing, are five-tiered in order from the bottom. In the second processing unit group G2, solution treatment units, for example, developing treatment units 30 to 34 each for supplying a developing solution to the wafer W to perform developing treatment on it are five-tiered in order from the bottom. Further, chemical chambers 40 and 41 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, a temperature regulating unit 60, a transition unit 61 for passing the wafer W, temperature regulating units 62 to 64, and heating processing units 65 to 68 each for heat-processing the wafer W are nine-tiered in order from the bottom.

In the fourth processing unit group G4, for example, a temperature regulating unit 70, pre-baking units 71 to 74 each for heat-processing (pre-baking) the wafer W after resist coating treatment, and post-baking units 75 to 79 each for heat-processing (post-baking) the wafer W after developing treatment, are ten-tiered in order from the bottom.

In the fifth processing unit group G5, for example, temperature regulating units 80 to 82, aligning units 83 to 85 each for aligning the wafer W, and post-exposure baking units 86 to 89 each for heat-processing (post-exposure baking) the wafer W after exposure processing, are ten-tiered in order from the bottom.

As shown in FIG. 1, on the positive direction side in the X-direction to the first transfer unit 10, a plurality of processing and treatment units are arranged, for example, adhesion units 90 and 91 each for performing hydrophobic treatment on the wafer W being two-tiered in order from the bottom as shown in FIG. 3. As shown in FIG. 1, on the positive direction side in the X-direction to the second transfer unit 11, for example, an edge exposure unit 92 is disposed which selectively exposes only the edge portion of the wafer W to light.

In the interface station 4, for example, a wafer transfer body 101 moving on a transfer path 100 extending in the X-direction and a buffer cassette 102 are provided as shown in FIG. 1. The wafer transfer body 101 is movable in the Z-direction and also rotatable in the O-direction, and thus can access the exposure apparatus adjacent to the interface station 4, the buffer cassette 102, and the fifth processing unit group G5 and transfer the wafer W to them.

For example, in the cassette station 2, a main control unit 110 is provided which controls operations of the above-described processing and treatment units, the wafer body, the transfer units and so on in the coating and developing treatment system 1 to perform the pattern forming processing on a film to be processed above the wafer W. The main control unit 110 is composed of, for example, a computer comprising a CPU and a memory, and can realize the pattern forming processing in the coating and developing treatment system 1, for example, by executing programs stored in the memory. Note that various kinds of programs for realizing the pattern forming processing in the coating and developing treatment system 1 may be ones stored in a recording medium H such as a computer-readable CD or the like, and installed on the main control unit 110 from the recording medium H.

Figure 4:
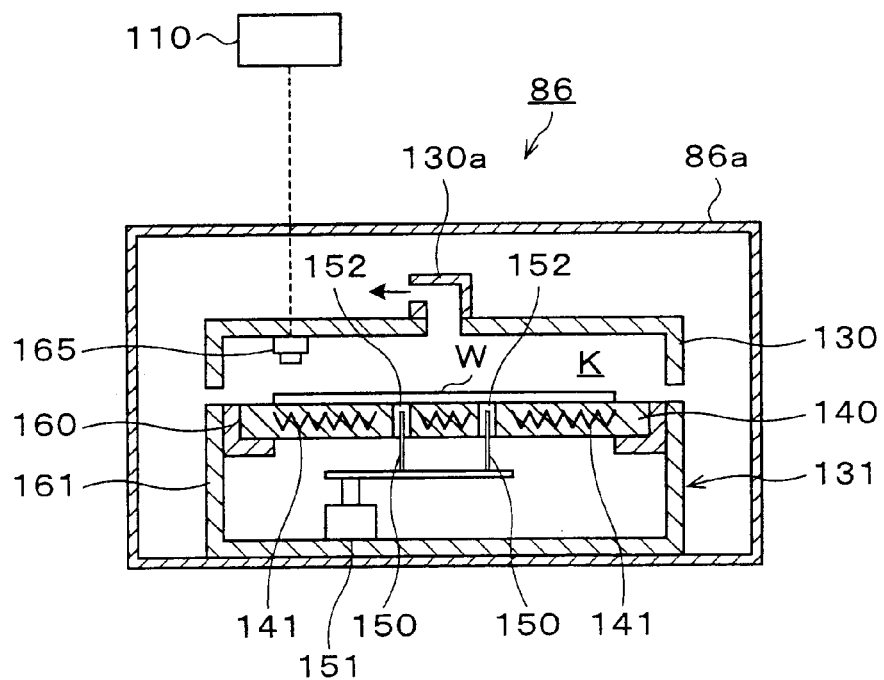
FIG. 4 is an explanatory view showing the outline of a configuration of a post-exposure baking unit.

Next, the configurations of the above-described post-exposure baking units 86 to 89 will be described. For example, the post-exposure baking unit 86 has, in a casing 86a as shown in FIG. 4, a lid body 130 that is located on the upper side and vertically movable, and a thermal plate accommodating unit 131 that is located on the lower side and forms a processing chamber K together with the lid body 130.

The lid body 130 has an almost cylindrical shape with a lower face open. The central portion of the upper surface of the lid body 130 is provided with an exhaust portion 130a. The atmosphere in the processing chamber K is uniformly exhausted through the exhaust portion 130a.

At the central portion of the thermal plate accommodating unit 131, a thermal plate 140 is provided as a thermal processing plate. The thermal plate 140 is formed in a substantial disk shape. Inside the thermal plate 140, heaters 141 are embedded which generate heat by power feeding and can heat the thermal plate 140 to a predetermined temperature.

For example, below the thermal plate 140, raising and lowering pins 150 are provided for supporting the wafer W from the lower side and raising and lowering it. The raising and lowering pins 150 can vertically move by means of a raising and lowering drive mechanism 151. The heating plate 140 is formed with through holes 152 vertically passing through the heating plate 140 near the central portion thereof. The raising and lowering pins 150 rise from below the thermal plate 140 and pass through the through holes 152 to project above the thermal plate 140.

The thermal plate accommodating unit 131 includes an annular supporting member 160 for accommodating the thermal plate 140 and supporting the outer peripheral portion of the thermal plate 140, and a support ring 161 in an almost cylindrical shape surrounding the outer periphery of the supporting member 160.

Further, in the post-exposure baking unit 86, a detecting member 165 such as a CCD sensor is provided for detecting a notch portion of the wafer W on the thermal plate 140. The detecting member 165 is attached, for example, to a ceiling surface on an inner side of the lid body 130. The detection result of the notch portion of the wafer W by the detecting member 165 can be outputted, for example, to the main control unit 110.

Note that the configurations of the post-exposure baking units 87 to 89 will be omitted since they are identical to that of the above-described post-exposure baking unit 86.

Figure 5:
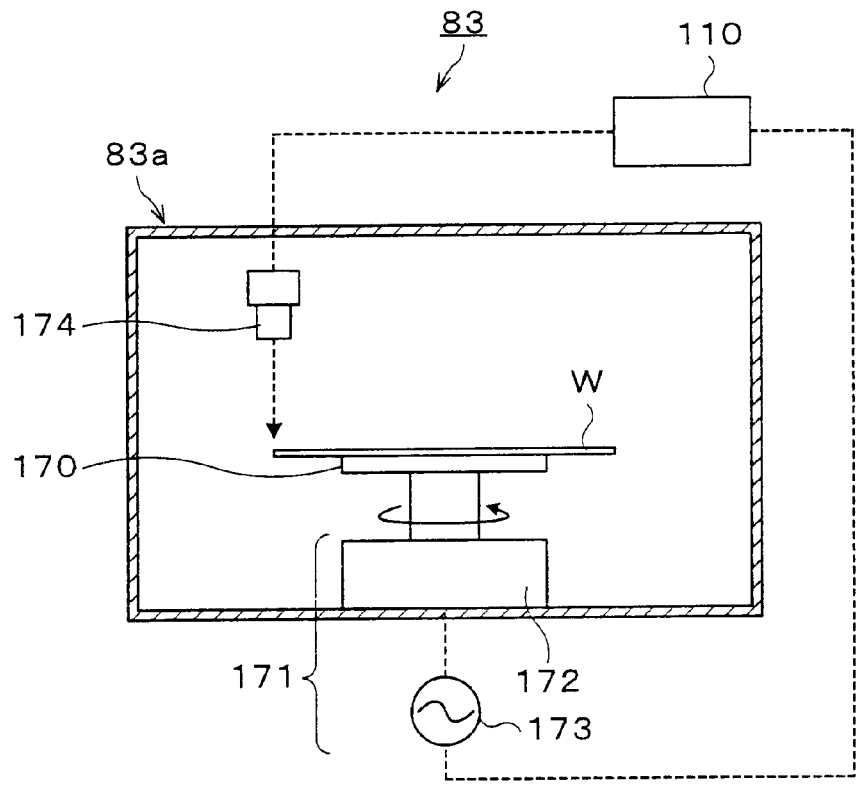
FIG. 5 is an explanatory view showing the outline of a configuration of an aligning unit.

Next, the configurations of the above-described aligning units 83 to 85 will be described. For example, the aligning unit 83 has, in a casing 83a as shown in FIG. 5, a holding member 170 for holding the wafer W. The holding member 170 has an upper surface which is horizontally formed, and the upper surface is formed with a not-shown suction port for sucking the wafer W. The suction from the suction port allows the wafer W to be suction-held by the upper surface of the holding member 170.

Below the holding member 170, a rotary drive mechanism 171 is provided as a drive mechanism for rotating the holding member 170. The rotary drive mechanism 171 includes a rotary drive unit 172 such as a servo motor and a power supply 173 therefor. The rotary drive unit 172 can rotate the holding member 170 a predetermined angle, for example, by an instruction signal from the main control unit 110.

Above the wafer W held by the holding member 170, a detecting member 174 such as a CCD sensor is provided for detecting the notch portion of the wafer W. The detection result of the notch portion of the wafer W by the detecting member 174 can be outputted, for example, to the main control unit 110. The main control unit 110 can control the operation of the rotary drive unit 172 based on the detection result of the notch portion of the wafer W by the detecting member 174 and the detection result of the notch portion of the wafer W by the detecting member 165, to rotate the wafer W on the holding member 170, thereby adjusting the position of the wafer W.

Note that the configurations of the aligning units 84 and 85 will be omitted since they are identical to that of the above-described aligning unit 83.

Figure 6:
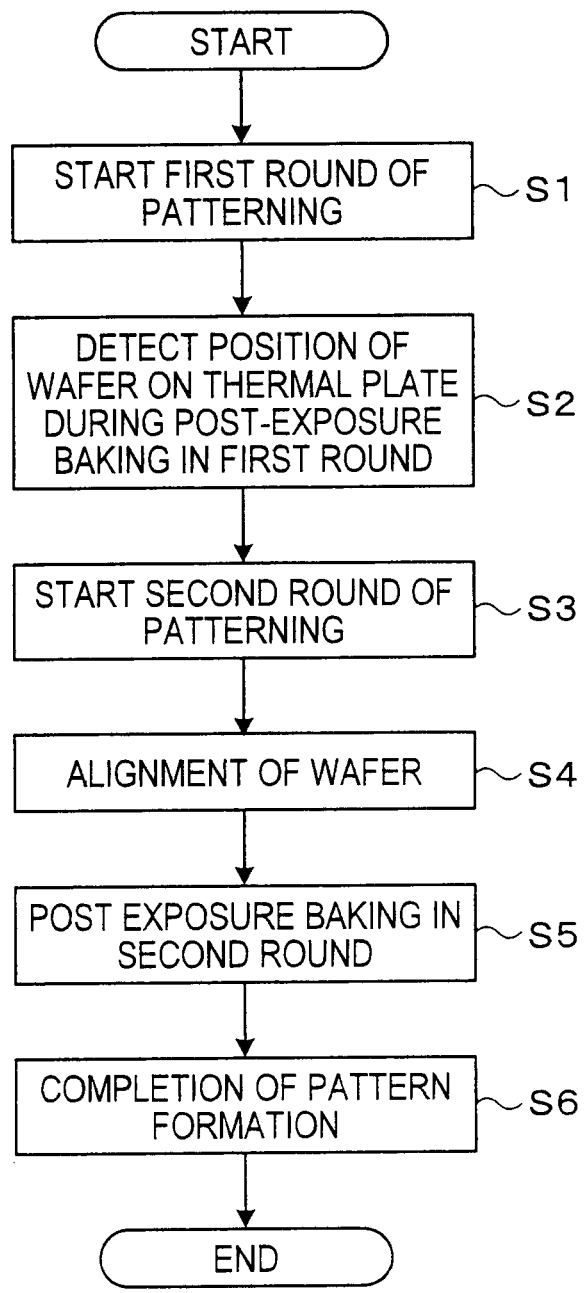
FIG. 6 is a flowchart of pattern forming processing.
Figure 7A:
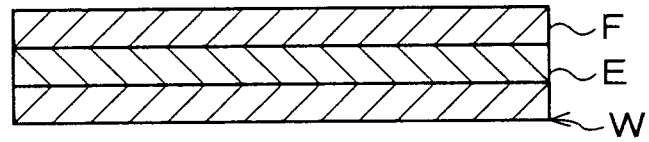
FIG. 7A is a longitudinal sectional view of a wafer before processing.

Next, the pattern forming process on the film to be processed above the wafer W which is performed using the above-described the coating and developing treatment system 1 will be described. FIG. 6 is a flowchart of this pattern forming process. Note that, in this embodiment, a case will be described taken as an example in which a lower-layer film E such as an organic lower-layer film has been formed on the surface of the wafer W, and an SOG (Spin On Glass) film F as the film to be processed as an upper-layer film on the lower-layer film E has been formed in advance as shown in FIG. 7A, and patterning is performed two rounds in total on the SOG film F.

Figure 7B:
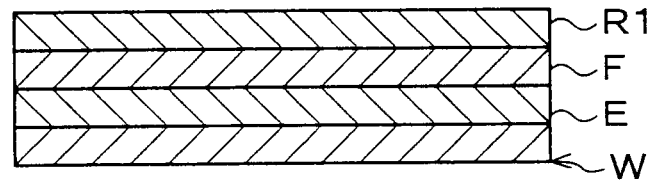
FIG. 7B is a longitudinal sectional view of the wafer above which a resist film in the first round is formed.

First of all, a first round of patterning is started (S1 in FIG. 6) in which wafers W in the cassette C shown in FIG. 1 are taken out by the wafer transfer body 7 one by one, and transferred to the temperature regulating unit 60 included in the third processing unit group G3 in the processing station 3. The wafer W is temperature-regulated in the temperature regulating unit 60, and is then transferred by the first transfer unit 10 to the resist coating unit 20. In the resist coating unit 20, a resist solution is applied, for example, onto the front surface of the wafer W to form a resist film R1 in the first round, for example, as shown in FIG. 7B.

The wafer W above which the resist film R1 in the first round is formed is transferred by the first transfer unit 10, for example, to the pre-baking unit 71 and subjected to pre-baking, and then transferred by the second transfer unit 11 to the edge exposure unit 92 and the temperature regulating unit 82 in sequence so that the wafer W is subjected to predetermined processing in each of the units. The wafer W is then transferred by the wafer transfer body 101 in the interface station 4 to the exposure apparatus, where a predetermined pattern is exposed on the resist film R1 above the wafer W. The wafer W for which exposure processing has been finished is transferred by the wafer transfer body 101, for example, to the post-exposure baking unit 86 in the processing station 3.

Figure 8:
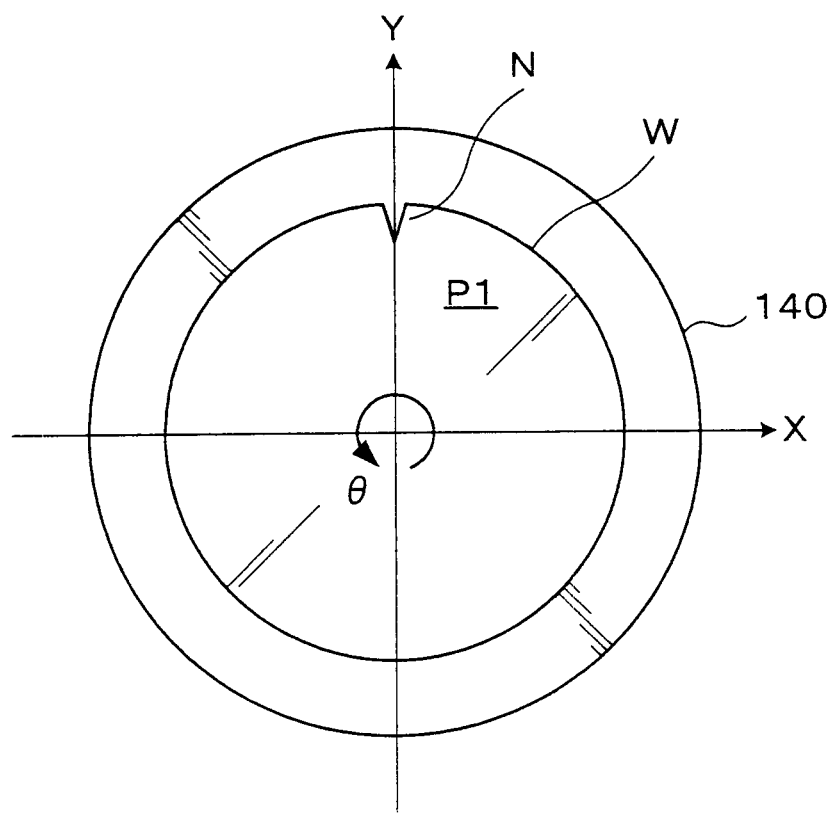
FIG. 8 is an explanatory view showing a position of the wafer on a thermal plate during post-exposure baking in the first round.

The wafer W transferred to the post-exposure baking unit 86 shown in FIG. 4 is passed to the raising and lowering pins 150 which have been raised and waiting in advance. Subsequently, the lid body 130 is lowered to form the processing chamber K, and the raising and lowering pins 150 are lowered to mount the wafer W on the thermal plate 140. Thus, the wafer W is heated by the thermal plate 140 to thereby perform the post-exposure baking in the first round. For example, in this event, a notch portion N of the wafer W as shown in FIG. 8 is detected by the detecting member 165, and the positional information on the notch portion N of the wafer W is outputted to the main control unit 110. In the main control unit 110, a position P1 of the wafer W on the thermal plate 140 is detected from the position of the notch portion N (S2 in FIG. 6) and stored.

The wafer W is heated on the thermal plate 140 for a predetermined period and then raised by the raising and lowering pins 150, with which the heating of the wafer W ends. The wafer W is then passed from the raising and lowering pins 150 to the second transfer unit 11 and transferred out of the post-exposure baking unit 86.

Figure 7C:
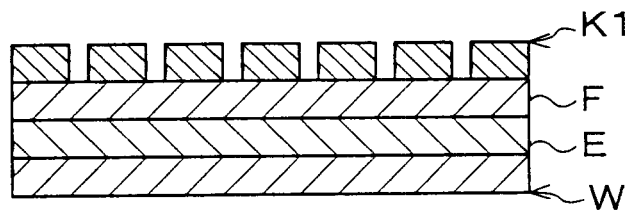
FIG. 7C is a longitudinal sectional view of the wafer above which a resist pattern in the first round is formed.

The wafer W for which the post-exposure baking has been finished is transferred, for example, by the second transfer unit 11 to the temperature regulating unit 70 and adjusted in temperature, and then transferred to the developing treatment unit 30. In the developing treatment unit 30, the resist film R1 above the wafer W is developed, whereby a resist pattern K1 is formed above the wafer W as shown in FIG. 7C.

Figure 7D:
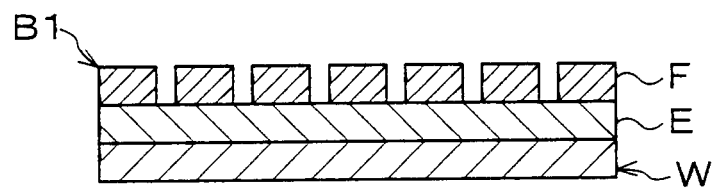
FIG. 7D is a longitudinal sectional view showing a state in which a pattern in the first round is formed in a film to be processed.

The wafer W is then transferred, for example, by the second transfer unit 11 to the post-baking unit 75 and subjected to post-baking, and then transferred by the first transfer unit 10 to the temperature regulating unit 62 and adjusted in temperature. The wafer W is then returned by the wafer transfer body 7 to the cassette C in the cassette station 2. For the wafer W returned to the cassette C, the SOG film F being the film to be processed is etched, for example, by a not-shown etching unit using the resist pattern K1 as a mask, and thereafter the resist pattern K1 no longer required is removed by a not-shown resist removing unit. Thus, the first round of patterning is completed, resulting in formation of a pattern B1 in the SOG film F above the wafer W as shown in FIG. 7D.

Figure 9A:
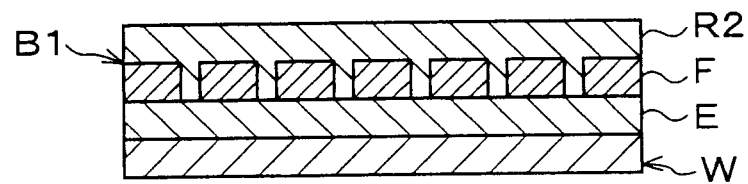
FIG. 9A is a longitudinal sectional view of the wafer above which a resist film in the second round is formed.

Subsequently, the wafer W is housed again, for example, in the cassette C, and a second round of patterning is started (S3 in FIG. 6). In the second round of patterning, like the first round of patterning, the wafer W is first transferred by the wafer transfer body 7 to the processing station 3, and then transferred to the resist coating unit 21, where a resist film R2 in a second round is formed on the SOG film F above the wafer W as shown in FIG. 9A.

The wafer W is then transferred to the pre-baking unit 71, the exposure apparatus and so on in sequence. In the exposure apparatus, the resist film R2 above the wafer W is exposed to light in a predetermined pattern. The wafer W for which exposure has been finished is transferred by the wafer transfer body 101, for example, to the aligning unit 83 in the fifth processing unit group G5.

Figure 10:
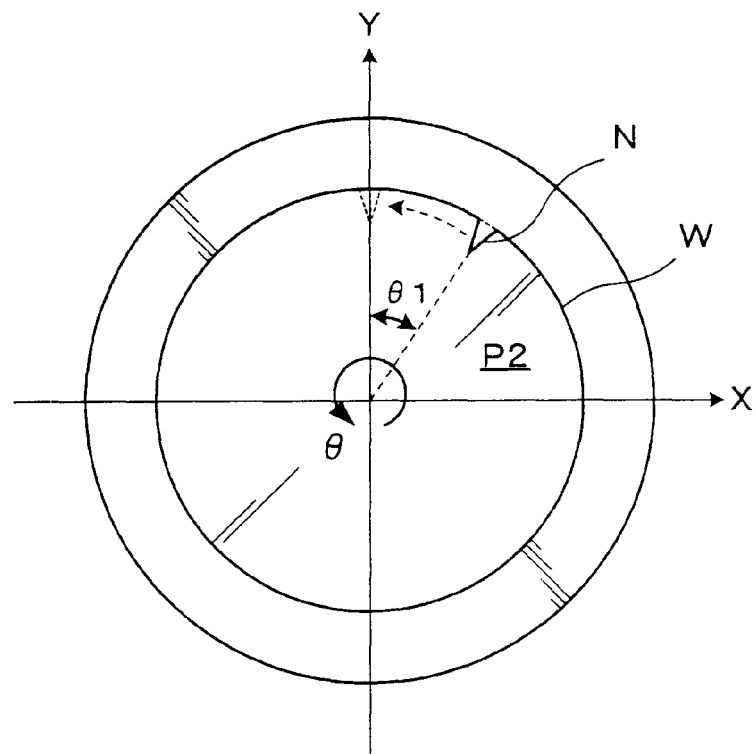
FIG. 10 is an explanatory view showing a position of the wafer on the thermal plate during post-exposure baking in the second round.

The wafer W transferred to the aligning unit 83 shown in FIG. 5 is held by the holding member 170. Subsequently, the notch portion N of the wafer W on the holding member 170 is detected by the detecting member 174, and the information on the position of the notch portion N is outputted to the main control unit 110. From the position of the notch portion N of the wafer W on the holding member 170, a position P2 of the wafer W on the thermal plate 140 when the wafer W will be mounted on the thermal plate 140 in the post-exposure baking in the subsequent step as shown in FIG. 10 is detected by the main control unit 110. The main control unit 110 compares the position P2 of the wafer W on the thermal plate 140 during the post-exposure baking in the second round to the position P1 of the wafer W on the thermal plate 140 during the post-exposure baking in the first round so as to calculate a deviation angle θ1 between them as shown in FIG. 10.

Based on the information on the deviation angle θ1, the rotary drive unit 172 is driven by the main control unit 110 so that the wafer W on the holding member 170 is rotated by an amount corresponding to the deviation angle θ1. Thus, the orientation of the θ-direction of the wafer W on the holding member 170 is adjusted such that the position P2 of the wafer W on the thermal plate 140 during the post-exposure baking in the second round is aligned with the position P1 of the wafer W on the thermal plate 140 during the post-exposure baking in the first round (S4 in FIG. 6).

The wafer W is then transferred, for example, by the second transfer unit 11 from the aligning unit 83, and transferred to the same post-exposure baking unit 86 as that for the post-exposure baking in the first round.

The wafer W transferred to the post-exposure baking unit 86 is mounted on the thermal plate 140 similarly to the post-exposure baking in the first round and subjected to the post-exposure baking in the second round (S5 in FIG. 6). Since alignment of the wafer W has been performed in advance in the aligning unit 83 in this event, the wafer W is mounted at the same position with respect to the thermal plate 140 as that during the post-exposure baking in the first round.

Figure 9B:
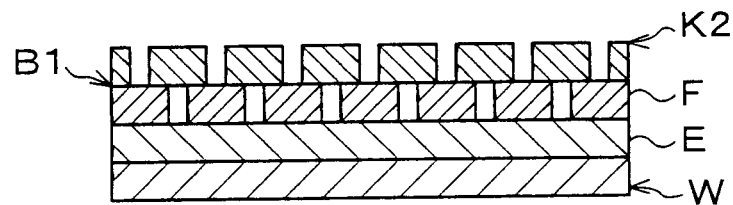
FIG. 9B is a longitudinal sectional view of the wafer above which a resist pattern in the second round is formed.
Figure 9C:
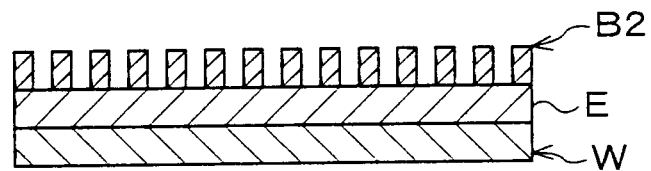
FIG. 9C is a longitudinal sectional view of the wafer with a final pattern formed in the film to be processed.

The wafer W for which the post-exposure baking has been finished is transferred, for example, to the developing treatment unit 31, the post-baking unit 76, and so on in sequence, whereby a resist pattern K2 in the second round is formed as shown in FIG. 9B. The wafer W is then returned to the cassette C in the cassette station 2, the SOG film F is then etched by the etching unit, and the resist pattern K2 is removed by the resist removing unit. Thus, the second round of patterning is completed, resulting in formation of a final pattern B2 in the SOG film F above the wafer W as shown in FIG. 9C (S6 in FIG. 6).

According to the above embodiment, the position P2 of the wafer W on the thermal plate 140 during the post-exposure baking in the second round of patterning is aligned with the position P1 of the wafer W on the thermal plate 140 during the post-exposure baking in the first round of patterning, so that the wafer W is mounted and subjected to thermal processing at the same position on the thermal plate 140 at all times in two rounds of patterning in total.

Figure 11:
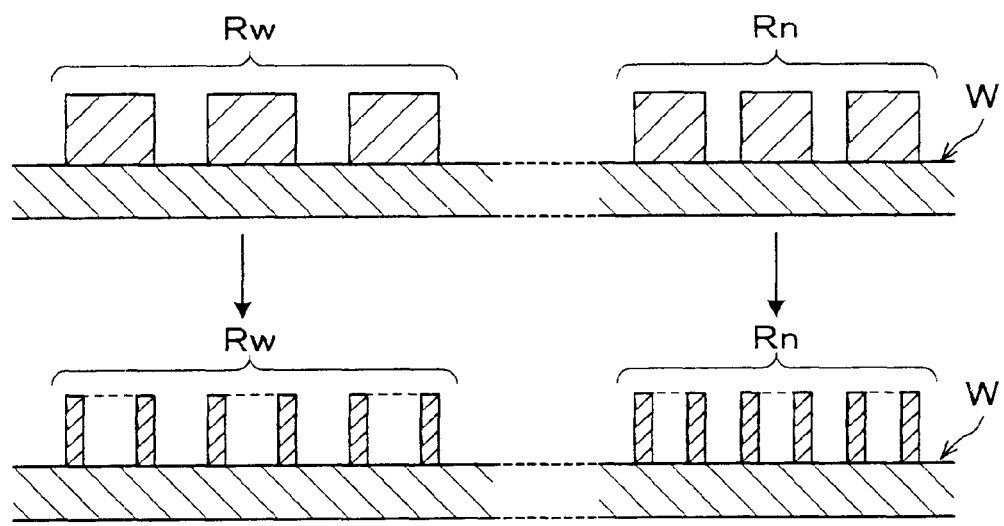
FIG. 11 is an explanatory view showing variations in line width when two rounds of patterning are performed.

As a result, two rounds of patterning having the same in-plane tendency of pattern dimension are performed in an overlap manner at the same position of the SOG film F above the wafer W, so that a pattern with a desired dimension is formed in the SOG film F above the wafer W. Further, the uniformity of the pattern dimension within the wafer can be ensured. In other words, as shown in FIG. 11, a portion where the line width will be relatively large in the second round of patterning is overlapped on a portion Rw where the line width is relatively large in the first round of patterning, and a portion where the line width will be relatively small in the second round of patterning is similarly overlapped on a portion Rn where the line width is relatively small in the first round of patterning. As a result, the line width with a desired dimension is finally uniformly formed over the entire surface of the wafer W.

In particular, the post-exposure baking is performed using the same thermal plate 140 in the post-exposure baking unit 86 in the first round of patterning and the second round of patterning in this embodiment, so that the inherent unevenness of temperature of the thermal plate 140 is completely the same, and rounds of patterning having completely the same in-plane tendency of pattern dimension are performed in an overlap manner at the same position, thereby making it possible to drastically improve the uniformity of the pattern dimension within the wafer.

Note that since the unevenness of temperature of the thermal plate 140 is also affected by the ambient environment and the like in the coating and developing treatment system 1 and similar unevenness of temperature occurs in the post-exposure baking units 86 to 89 which are of the same type, the effect in this embodiment can be attained even in the case using the thermal plates 140 in different post-exposure baking units 86 to 89 in the first and second rounds of patterning.

Since the detecting member 165 is provided in the post-exposure baking unit 86 in this embodiment, the position of the wafer W on the thermal plate 140 during the post-exposure baking in the first round of patterning can be accurately detected.

Provision of the aligning unit 83 in the coating and developing treatment system 1 makes it possible to transfer the wafer W to the aligning unit 83 and perform alignment of the wafer W immediately before the wafer W is mounted on the thermal plate 140 in the post-exposure baking unit 86. Therefore, the position of the wafer W on the thermal plate 140 in the second round of patterning can be accurately aligned with the position of the wafer W on the thermal plate 140 in the first round of patterning. Further, the aligning unit 83 includes the holding member 170, the rotary drive mechanism 171, and the detecting member 174, and thus can accurately perform the alignment of the wafer W.

Though the dedicated aligning units 83 to 85 are provided as aligning mechanisms in the coating and developing treatment system 1 in the above embodiment, the post-exposure baking units 86 to 89 may include the aligning mechanisms.

Figure 12:
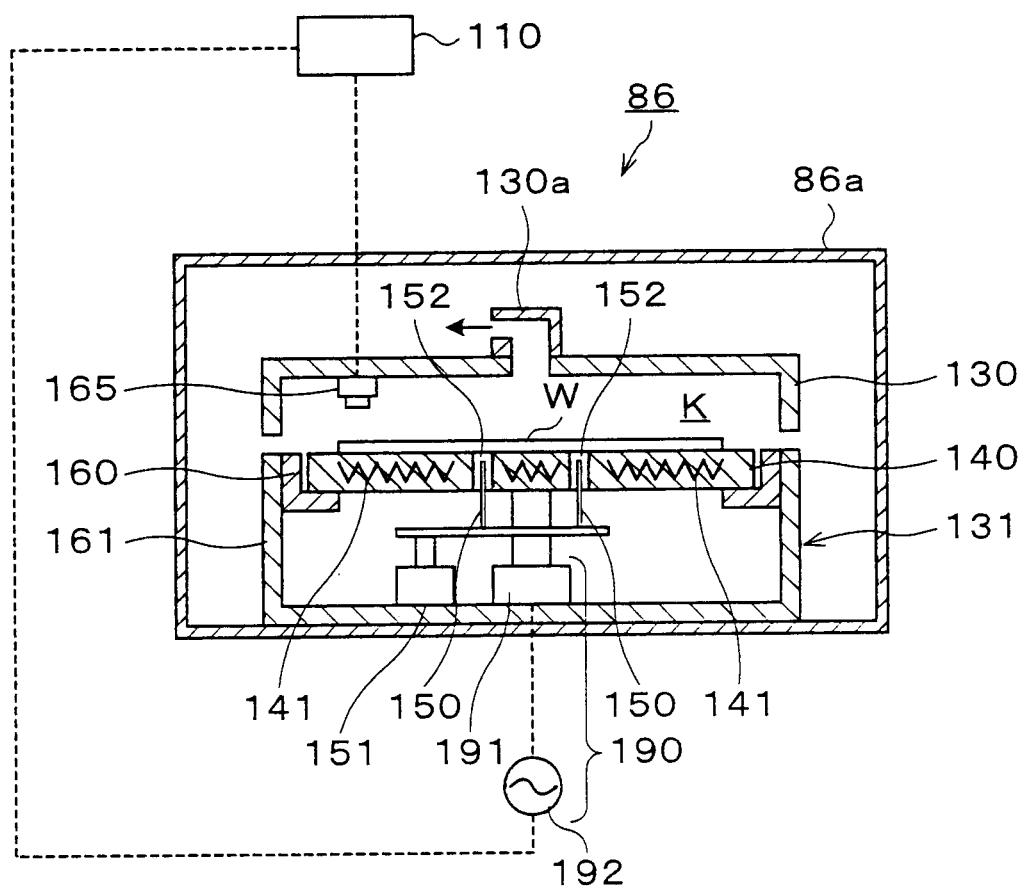
FIG. 12 is an explanatory view showing the outline of a post-exposure baking unit including a rotary drive mechanism.

In this case, for example, at the lower surface of the thermal plate 140, a rotary drive mechanism 190 is provided as a drive mechanism for rotating the thermal plate 140 as shown in FIG. 12. The rotary mechanism 190 includes a rotary drive unit 191 such as a servo motor or the like, a power supply 192 therefor and so on. The rotary drive unit 191 can rotate the thermal plate 140 a predetermined angle, for example, by an instruction signal from the main control unit 110.

The detecting member 165 can detect the notch portion N of the wafer W, for example, supported on the raising and lowering pins 150. The detection result of the notch portion by the detecting member 165 can be outputted to the main control unit 110. The main control unit 110 can control the operation of the rotary drive unit 191 based on the detection result of the notch portion by the detecting member 165 to rotate the thermal plate 140, thereby adjusting the position of the wafer W when the wafer W is mounted on the thermal plate 140.

Figure 13:
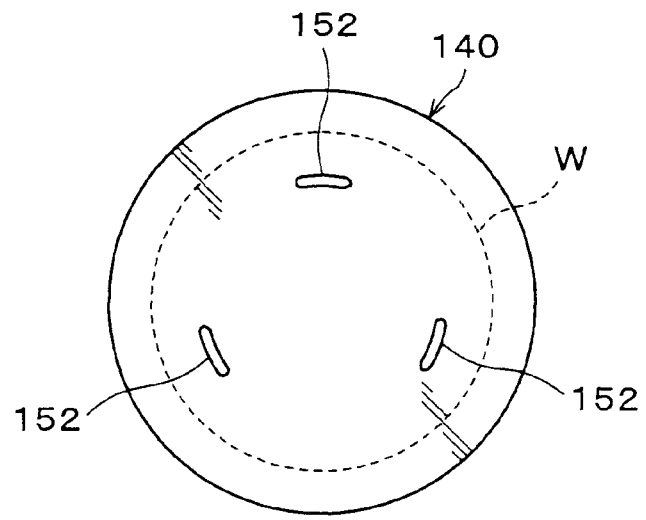
FIG. 13 is a plan view of a thermal plate having through holes in an arc shape.
Figure 14:
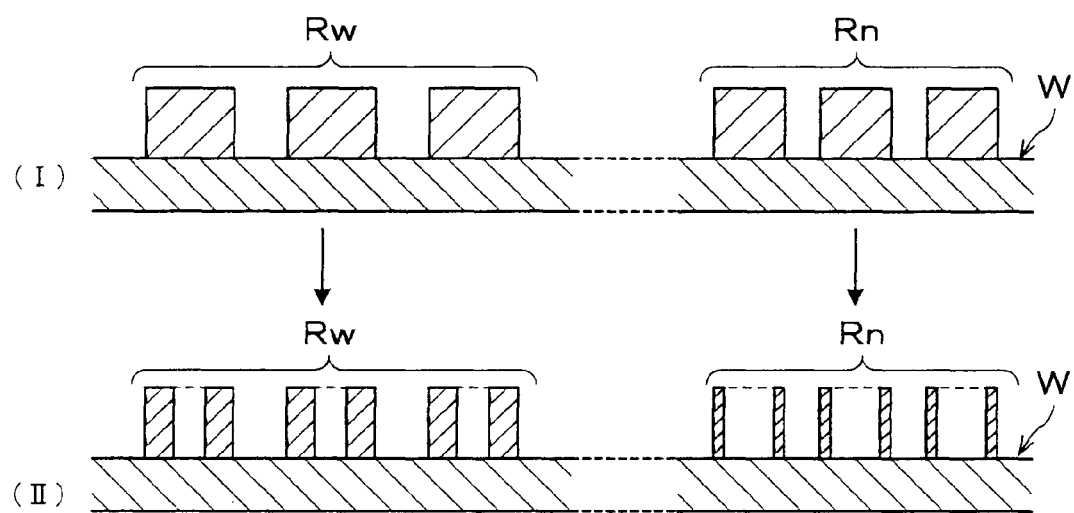
FIG. 14 is an explanatory view showing variations in line width when two rounds of patterning are performed by a conventional method.

Each of the through holes 152 of the thermal plate 140 is formed, for example, in an arc shape as shown in FIG. 13 so that the thermal plate 140 can be rotated with the raising and lowering pins 150 passing through the through holes 152. Note that the remaining configuration of the post-exposure baking unit 86 is the same as that in the above-described embodiment and its description will be omitted.

When the wafer W is then transferred into the post-exposure baking unit 86 and passed onto the raising and lowering pins 150 in the second round of patterning, the notch portion N of the wafer W is detected by the detecting member 165. The positional information of the notch portion N of the wafer W is outputted to the main control unit 110, and the position P2 of the wafer W on the thermal plate 140 during the post-exposure baking in the second round is detected by the main control unit 110. The main control unit 110 compares the position P2 of the wafer W on the thermal plate 140 in the second round of patterning to the position P1 of the wafer W on the thermal plate 140 in the post-exposure baking unit 86 in the first round of patterning so as to calculate the deviation angle $\theta_1$ between them. Based on the information on the deviation angle $\theta_1$, the rotary drive unit 191 is driven by the main control unit 110 so that the thermal plate 140 is rotated by an amount corresponding to the deviation angle $\theta_1$, whereby the position P2 of the wafer W on the thermal plate 140 during the post-exposure baking in the second round is aligned with the position P1 of the wafer W during the post-exposure baking in the first round.

Thereafter, the raising and lowering pins 150 are lowered to mount the wafer W onto the thermal plate 140 so that the post-exposure baking of the wafer W is performed.

According to this example, since the mount position of the wafer W on the thermal plate 140 is adjusted in the post-exposure baking unit 86, it is unnecessary to separately provide the dedicated aligning unit, unlike the above-described embodiment, thereby allowing efficient use of the space in the coating and developing treatment system 1 according thereto. In addition, elimination of the step of transferring the wafer W into the aligning unit can improve the throughput of the wafer processing. Note that the drive mechanism of the thermal plate 140 in the post-exposure baking unit 86 may be used together with the above-described aligning unit to perform alignment of the wafer W.

A preferred embodiment of the present invention has been described above with reference to the accompanying drawings, and the present invention is not limited to the embodiment. It should be understood that various changes and modifications within the scope of the spirit as set forth in claims are readily apparent to those skilled in the art, and those should also be covered by the technical scope of the present invention.

Though the alignment of the wafer W is performed by rotating the wafer W in the θ-direction in the above embodiment, the alignment of the wafer W may be performed by moving the wafer W in the X-Y direction being the horizontal direction. In this case, for example, an X-Y stage for moving the thermal plate 140 in the X-Y direction may be provided in the post-exposure baking unit 86.

While the position of the wafer W on the thermal plate 140 is detected by detecting the not portion of the wafer W in the above embodiment, an alignment mark may be formed in the wafer W in advance, and the position of the wafer W may be detected with reference to the alignment mark.

Though the alignment of the mount position of the wafer W on the thermal plate during the post-exposure baking is performed in the two rounds of patterning in the above embodiment, the alignment of the mount position of the wafer W on the thermal plate during the post-baking may be performed. Further, the mount position of the wafer W may be aligned both during the post-exposure baking and during the post-baking. Furthermore, the alignment of the mount position of the wafer W may be performed also in other thermal processing such as pre-baking or the like using the thermal processing plate.

The number of rounds of patterning is two in the above embodiment, and the present invention is also applicable to the case of three rounds or more. In the case of three rounds or more, the position of the wafer W on the thermal plate 140 during each of the third and subsequent rounds of patterning is aligned with the position of the wafer W on the thermal plate 140 in the first round of patterning. Besides, the film to be processed in which the pattern will be formed is not limited to the SOG film but may be other kinds of films. Furthermore, the present invention is also applicable to processing for substrates other than the wafer, such as an FPD (Flat Panel Display), a mask reticle for a photomask, and the like.

The present invention is useful in forming a pattern with a desired dimension by a plurality of rounds of patterning.

What is claimed is:

1. A substrate processing system for performing a plurality of rounds of patterning on a film to be processed located at a same layer above a surface of a substrate, comprising:
   a thermal processing plate for mounting and thermally processing the substrate thereon in each of the rounds of patterning; and
   an aligning mechanism for aligning a position of the substrate with respect to said thermal processing plate when the substrate is mounted on said thermal processing plate in the thermal processing in each of second and subsequent rounds of patterning with a position of the substrate with respect to said thermal processing plate when the substrate is mounted on said thermal processing plate in the thermal processing in a first round of patterning,
   wherein said aligning mechanism includes a drive mechanism which adjusts the position of said thermal processing plate by rotating said processing plate in each of the second and subsequent rounds of patterning to rotationally align the position of the substrate with the position of the substrate in the first round of patterning.

2. The substrate processing system as set forth in claim 1, further comprising:
   a detecting member for detecting the position of the substrate on said thermal processing plate in the thermal processing in the first round of patterning,
   wherein the alignment of the substrate on said thermal processing plate in each of the second and subsequent rounds of patterning is performed based on the detection result in said detecting member.

3. The substrate processing system as set forth in claim 1, wherein said aligning mechanism includes an aligning unit for aligning the substrate immediately before being mounted on said thermal processing plate in each of the second and subsequent rounds of patterning, and
   wherein said aligning unit includes:
   a holding member for holding the substrate; a detecting member for detecting the position of the substrate held by said holding member; and the drive mechanism moves said holding member based on the detection result by said detecting member.

4. The substrate processing system as set forth in claim 1, wherein said aligning mechanism further adjusts an X-Y position of said thermal processing plate in each of the second and subsequent rounds of patterning.

5. The substrate processing system as set forth in claim 1, wherein said same thermal processing plate as in the thermal processing in the first round of patterning is used for said thermal processing plate for performing the thermal processing in each of the second and subsequent rounds of patterning.

6. The substrate processing system as set forth in claim 1, wherein the thermal processing is heating processing performed after exposure processing and before developing treatment in the patterning and/or heating processing after developing treatment.

7. A computer-readable recording medium recording a program thereon for causing a computer controlling a substrate processing system to implement a substrate processing method, said substrate processing system performing a plurality of rounds of patterning on a film to be processed located at a same layer above a surface of a substrate,
   said substrate processing method comprising:
   a thermal processing step of mounting and thermally processing the substrate on a thermal processing plate in each of the rounds of patterning,
   wherein a position of the substrate with respect to the thermal processing plate when the substrate is mounted on the thermal processing plate in said thermal processing step in each of second and subsequent rounds of patterning is aligned with a position of the substrate with respect to the thermal processing plate when the substrate is mounted on the thermal processing plate in said thermal processing step in a first round of patterning, and wherein adjusting the position of the thermal processing plate is performed by rotating the thermal processing plate to rotationally align the position of the substrate in the second round of patterning with the position of the substrate in the first round of patterning.

8. The substrate processing system as set forth in claim 4, wherein said drive mechanism is a rotary drive mechanism which rotate said thermal processing plate for use in each of the second and subsequent rounds of patterning.

9. A substrate processing system for performing a plurality of rounds of patterning on a film to be processed located at a same layer above a surface of a substrate, comprising:

a thermal processing plate which mounts and thermally processes the substrate thereon in each of the rounds of patterning; and an aligning mechanism which aligns a first position of the substrate with respect to said thermal processing plate for a first round of patterning and which realigns a second position of the substrate with respect to said thermal processing plate in each of second and subsequent rounds of patterning to the same position on the thermal processing plate as the first position.

10. The substrate processing system as set forth in claim 9, wherein said aligning mechanism rotationally aligns the second position of the substrate in the second and subsequent rounds of patterning with the first position of the substrate in the first round of patterning.

11. The substrate processing system as set forth in claim 9, further comprising:

a detecting member for detecting the first position of the substrate on said thermal processing plate in the thermal processing in the first round of patterning, wherein the alignment of the substrate on said thermal processing plate in each of the second and subsequent rounds of patterning is performed based on the detection result in said detecting member.

12. The substrate processing system as set forth in claim 9, wherein said aligning unit includes:

a holding member for holding the substrate; a detecting member which detects the position of the substrate held by said holding member; and a drive mechanism which moves said holding member based on the detection result by said detecting member.

13. The substrate processing system as set forth in claim 9, wherein said aligning mechanism further adjusts an X-Y position of said thermal processing plate in each of the second and subsequent rounds of patterning.

14. The substrate processing system as set forth in claim 9, wherein said same thermal processing plate as in the thermal processing in the first round of patterning is used for said thermal processing plate for performing the thermal processing in each of the second and subsequent rounds of patterning.

15. The substrate processing system as set forth in claim 9, wherein the thermal processing is heating processing performed after exposure processing and before developing treatment in the patterning and/or heating processing after developing treatment.

* * * * *

UNITED STATES PATENT AND TRADEMARK OFFICE
CERTIFICATE OF CORRECTION

| | |
|---|---|
| PATENT NO. | : 8,587,763 B2 |
| APPLICATION NO. | : 13/158971 |
| DATED | : November 19, 2013 |
| INVENTOR(S) | : Takahisa Otsuka |

It is certified that error appears in the above-identified patent and that said Letters Patent is hereby corrected as shown below:

On the title page, Item (73), the Assignee's Information is incorrect. Item (73) should read:

--(73) Assignee: Tokyo Electron Limited, Tokyo (JP)--

Signed and Sealed this
Eleventh Day of February, 2014

Michelle K. Lee
*Deputy Director of the United States Patent and Trademark Office*